United States Patent [19]

Albridge, Jr. et al.

[11] Patent Number: 4,775,789

[45] Date of Patent: Oct. 4, 1988

[54] METHOD AND APPARATUS FOR PRODUCING NEUTRAL ATOMIC AND MOLECULAR BEAMS

[76] Inventors: Royal G. Albridge, Jr., 6504 Pennywell Dr., Nashville, Tenn. 37205; Richard F. Haglund, Jr., 1797 Harpeth River Dr., Brentwood, Tenn. 37027; Kenneth J. Snowdon, 2121 Fairfax Ave., Nashville, Tenn. 37212; Norman H. Tolk, 314 Appomattox Dr., Brentwood, Tenn. 37027

[21] Appl. No.: 841,142

[22] Filed: Mar. 19, 1986

[51] Int. Cl.[4] .............................................. H01J 37/26

[52] U.S. Cl. ..................................... 250/251; 250/398

[58] Field of Search .................... 250/251, 398, 396 R, 250/306, 307, 309, 492.1, 492.2, 492.3

[56] References Cited

U.S. PATENT DOCUMENTS 2,890,342 6/1959 Coulombe ........................... 250/251
3,424,904 1/1969 Donnally ............................ 250/251
3,660,655 5/1972 Wardell ............................... 250/309
3,700,899 10/1972 Kaminsky ........................... 250/251
3,767,925 10/1973 Foley, Jr. et al. ................. 250/251
4,019,989 4/1977 Hazewindus et al. ...... 250/396 ML

OTHER PUBLICATIONS

Barnett et al., "Energy Dispersed Neutral Beams," Rev. Sci. Instr., 43 (1), (1972).

*Primary Examiner*—Bruce C. Anderson
*Assistant Examiner*—Paul A. Guss
*Attorney, Agent, or Firm*—Macdonald J. Wiggins

[57] ABSTRACT

A method and apparatus for producing a neutral beam of oxygen or other gas for use in testing of materials and for heavy particle etching is disclosed. A beam of positively ionized gas is accelerated and filtered to produce a beam having ions of a selected energy. The beam is decelerated to an energy of the level required and directed toward a photo emissive surface at a grazing incidence angle causing electrons to be contributed to the beam thereby neutralizing part of the ionized atoms and molecules of the beam. The beam is directed through electrostatic deflection plates which separate out remaining ionized particles producing a neutral beam.

16 Claims, 2 Drawing Sheets

METHOD AND APPARATUS FOR PRODUCING NEUTRAL ATOMIC AND MOLECULAR BEAMS

BACKGROUND OF THE INVENTION

1. Field of the Invention

The present invention relates to atomic and molecular beams and more particularly to an apparatus and method for producing controllable low energy neutral atomic and molecular beams.

2. Description of the Prior Art

With the increasing use of low earth orbit vehicles and satellites, problems with the residual atmosphere in such orbits has surfaced as evidenced by significant erosion of exposed surfaces. The environment in the region of low earth orbits at 300–500 km is primarily atomic oxygen. Although there are few atoms at this altitude, the high velocity of the orbiting payloads and the high reactivity of atomic oxygen degrade many organic surface materials at a high rate. The erosion is most severe on organic polymers containing carbon, hydrogen, oxygen, nitrogen and sulfur. See the following reports: L. J. Leger, J. T. Visentine, and J. A. Schliesing, "A consideration of atomic oxygen interactions with space station", AIAA-85-0476, Proc., AIAA 23rd Aerospace Sciences Meeting, Reno, NV, Jan. 14–17, 1985 and A. F. Whitaker, S. A. Little, R. J. Harwell, D. B. Griner, R. F. Dehaye, and A. T. Fromhold, Jr., "Orbital atomic oxygen effects on thermal control and optical materials—STS-8 results", AIAA-85-0416, Proc. AIAA 23rd Aerospace Sciences Meeting, Reno, NV, Jan. 14–17, 1985.

It is necessary to be able to predict the useful lifetime of components in the design of space stations and other space vehicles. In the past, various materials have been investigated by exposing materials in low earth orbit and recovering the materials for analysis. This approach is costly in time and money and opportunities for such testing are limited. It is therefore highly desirable to be able to simulate the low earth orbit environment in the laboratory.

The predominant constituent of this environment, as mentioned above, is atomic oxygen formed by the photodissociation of molecular oxygen. The atomic oxygen, at densities of $10^7$–$10^9$ atom/cm$^3$, has only thermal energy. However, a spacecraft traveling at a velocity of 8 km/s experiences a flux of $10^{13}$–$10^{15}$ atom/cm$^2$s with an average atomic energy of 5 ev. The material surface also can be exposed to ultraviolet (UV) radiation depending on its orientation, and a flux of nitrogen gas molecules depending on its altitude. Ideally, laboratory tests would allow atomic oxygen, nitrogen molecules, and UV photons to be incident on samples both separately and in the various combinations. However, the major problem is the generation in the laboratory of the flux of atomic oxygen which is believed to be the most damaging of these several factors.

Such a flux of atomic oxygen has not been readily available in the laboratory in the prior art for a variety of reasons: atomic oxygen is not stable against recombination; the fluxes desired are relatively high; neutral beams are difficult to manipulate; and 5 eV ions are too low in energy to easily focus and velocity select, but too high in energy to generate thermally. See J. B. Cross and D. A. Cremers, "Atomic oxygen surface interactions-mechanistic study using ground-based facilities", AIAA-85-0473, Proc. AIAA 23rd Aerospace Sciences Meeting, Reno, NV, Jan. 14–27, 1985.

A need exists for methods to produce a controlled low energy beam of atomic oxygen in the laboratory to permit simulation of low earth orbit environments.

SUMMARY OF THE INVENTION

The present invention provides a method and apparatus for producing a pure neutral oxygen beam. A Colutron ion gun generates a beam of ionized oxygen atoms including $O_2^+$ and $O^+$. The ions are accelerated by means of an electrostatic accelerator and passed through a Wien filter to select the desired velocity atomic and molecular species.

The stream will be at a relatively high energy level on the order of 3 keV. The filtered beam is passed through a decelerator to reduce the energy to the 5–10 eV level. A flat or slightly curved surface is placed in the path of the lower velocity beam such that the beam strikes the surface at grazing incidence, typically in the range of 1 degree to 4 degrees. The surface may be metal, metal oxide or a semiconductor material. A preferred material is a highly polished nickel crystal.

Upon striking the surface, electronic processes occur that contribute electrons to the atoms and molecules resulting in partial neutralization of the beam. The beam emerging from the neutralizer surface therefore contains neutral atoms and molecules as well as ionized atoms and molecules. The beam is next passed through electrostatic deflectors which separate the remaining ions, leaving a neutral beam. A sample to be tested is placed such that the neutral beam strikes the sample.

Analysis of the materials desorbing from the sample can be performed in numerous ways. For example, a laser directed toward the sample may be tuned to excite resonance lines of individual atomic and molecular species. A spectrometer may then identify reactants and products from the characteristic line radiation.

It is therefore a principal object of the invention to provide a method and apparatus for producing and controlling a beam of neutral gas atoms and molecules.

It is another object of the invention to provide a method and apparatus for permitting controlled testing of materials, or treatment of materials by bombardment with a neutral atomic beam.

It is still another object of the invention to provide a method and apparatus which utilizes an ion beam composed of gas atoms and molecules which can be accelerated, filtered, focused, and controlled to impinge at a grazing incidence angle on a surface which supplies electrons to thereby neutralize positive ions in the beam.

It is yet another object of the invention to provide apparatus for passing the neutralized beam through an electrostatic deflection system to separate out remaining ion atoms and molecules to thereby produce a pure neutral atomic and molecular beam.

These and other objects and advantages of the invention will become apparent from the following detailed description when read in conjunction with the drawing.

DETAILED DESCRIPTION OF THE PREFERRED EMBODIMENT

The present invention permits the forming, focusing, and controlling of a beam of non-ionized or neutral atoms and molecules of a desired gas. As will be understood, any ionizable gas is suitable for practice of the invention. For purposes of description and illustration, the use of oxygen in such beams will be described which has particular application to the testing of materials for use in near earth orbit vehicles.

Figure 1:
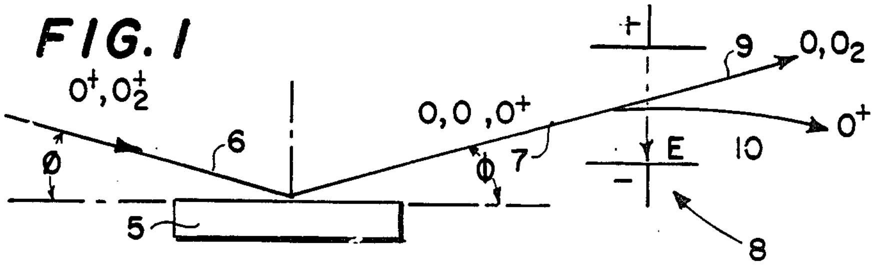
FIG. 1 is a schematic diagram of a positively ionized oxygen beam striking a surface in accordance with the invention for neutralizing the beam.

It is known to produce and control ionized beams of gases such as oxygen. In FIG. 1, a positively ionized beam 6 is shown which consists primarily of positively charged oxygen atoms and positively charged oxygen molecules. The beam 6 is directed toward a plate 5 so as to strike a surface of plate 5 at a grazing angle $\theta$. The invention operates most efficiently when angle $\theta$ is very small. For example, it has been found that angles of 1 to 4 degrees provides high efficiency of operation. As angle $\theta$ increases, the invention still operates but with reduced efficiency. As the ionized beam 6 strikes the surface of plate 5, electronic processes occur which result in electrons from the surface attaching to the oxygen ions and producing neutral oxygen atoms and molecules. The beam is reflected at an angle $\theta$ and will be composed of neutral oxygen atoms, neutral molecules, and remaining ions which were not neutralized.

As will be understood, the plate 5 is preferably formed from a material having good photoemission properties and will have a large density of nearly-free electrons at the surface. The percentage of neutralization of the beam is a function of the grazing angle and the energy of the incident beam. Thus, beam 7, which has been deflected from the surface of plate 5, will still contain ionized atoms and molecules. Beam 7 is passed through a pair of electrostatic deflection plates 8 which deflect the ionized particles, for example, positive oxygen atoms as indicated at 10. A beam 9 emerges from the deflection plates formed of neutral oxygen atoms and molecules.

Figure 3:
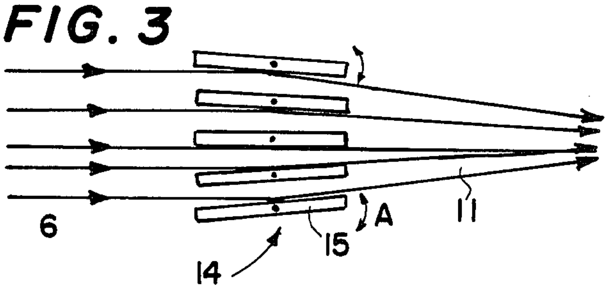
FIG. 3 shows a surface device similar to FIG. 2 in which the angles of the surfaces are adjustable to control the cross-sectional area and density of the neutralized beam.

In certain applications of the invention, it is desired to have a beam having a large cross-section. As shown in FIG. 3, the neutralizing plate system 12 may be utilized in which a plurality of plates is provided. Thus, an incoming beam 6 may have a large cross-sectional area and thereby produce a broad neutralized beam 7.

Figure 2:
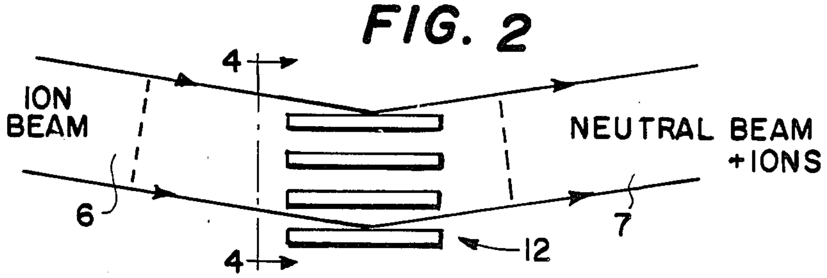
FIG. 2 is a schematic diagram showing the use of multiple surfaces for use with an ionized beam having a large cross-sectional area.
Figure 4:
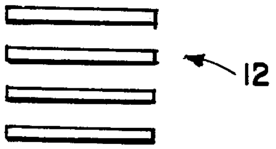
FIG. 4 is a view of the surfaces of FIG. 2 in the plane 4—4 thereof.
Figure 5:
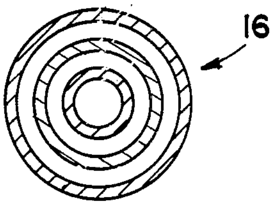
FIG. 5 is an alternative multiple surface arrangement using cylindrical surfaces for producing circular beams.

Although the ionized beam 6 in FIG. 1 and 2 can be focused with known techniques, the neutralizing plate system of FIG. 3 may be used to produce focusing of the neutralized beam to a certain degree. Here, the neutralizing system 14 is formed from a plurality of plates 15 which have their angles with respect to the incoming beam 6 independently adjustable as indicated by arrow A. For example, in FIG. 3 the plates 15 are adjusted at various angles such as to cause the neutralized beam 11 to converge. As may also be noted, this convergence will increase the density of the beam at the point of use. Alternatively, the surfaces 15 could be adjusted to cause the neutralized beam 11 to diverge thereby covering a larger area and with a lower density. The shape of the beam of neutralized atoms and molecules can also be controlled by the form of the neutralizing plates system. For example, FIG. 4 shows the configuration in the plane 4—4 of FIG. 2 which will produce a rectangular beam of neutralized atoms and molecules when a large cross-sectional area ionized beam is directed into neutralizing plate 12. In FIG. 5, a set of cylindrical neutralizing plates 16 is shown which will convert a large cross-sectional area ion beam directed thereon into a circular neutralized beam. The cylinders of FIG. 5 can also be set at angles with each other so as to produce a converging or diverging neutral beam.

Having described the method of producing a neutral gas beam, for example, a neutral beam of atomic and molecular oxygen, a preferred apparatus for generating such beams will be described with reference to the schematic diagram of FIG. 6.

A vacuum chamber 20 is provided having an ultrahigh vacuum on the order of $10^{-10}$ Torr. A Colutron gun 30 is utilized as a source of the ionized gas beam. Gun 30 is available from the Colutron Corporation. In this example, an oxygen beam is to be generated and a source of oxygen gas 22 is provided to the gun 30. Helium 23 is also introduced as is well known to prevent damage due to the high reactivity of oxygen on heated elements of gun 30. A beam 17 is emitted from gun 30 and is composed of positively charged oxygen atomic and molecular ions mixed with helium atoms and various contaminants which may unavoidably be present. The beam 17 is passed through an accelerator 18 which is used to increase the energy of beam 17; for example to 3 keV. The output from accelerator 18 is accelerated beam 19 which is then passed through Wien filter 33. As is well known in the art, the Wien filter 33 may be adjusted to select and pass the oxygen ions (or molecular ions), which will have a specific kinetic energy and velocity, and to reject the helium ions and impurity ions having different velocities. As will be noted, the purpose of accelerator 18 is to raise the beam 17 to a sufficient velocity to permit these extraneous portions of the beam to be removed by the Wien filter 33. Thus, beam 21 exiting from filter 33 is essentially oxygen ions (or molecular ions) each having a positive charge.

For the purposes of testing a material 32 by simulation of the problems encountered in near earth orbit environments, the kinetic energy is required to be on the order of 5 eV. Therefore, a decelerator 35 is provided to reduce the velocity of beam 21 such that beam 23 is within the desired energy range.

A bolometer or Faraday cup sensor 24 may be installed following decelerator 25 to determine the flux of the beam.

In some instances, it is desired to have a thin wide beam. In such case, a plate 26 having a thin horizontal slit therein may be utilized to produce a thin wide beam 25 which strikes the neutralizing device 28 at the required grazing angle. As previously described, the ionized beam 25 will pick up electrons from the surface of plate 28 thereby neutralizing a portion of the atoms and molecules of oxygen. Beam 27 deflected from plate 28 will therefore be composed of neutralized oxygen atoms and molecules, plus remaining positive ions and negative particles which may have been picked up from surface 28. The beam 27 is passed through electrostatic deflection plates 31 which separate out remaining ionized particles producing a beam 29 composed of neutral oxygen atoms and molecules.

In one embodiment of the invention, neutralizing plate 28 was formed from a highly polished nickel crystal although other materials are suitable.

Neutral beam 29 is permitted to strike sample 32 which is to be tested and analyzed. This causes erosion of the material on the surface of sample 32 and the impinging and desorbing materials 40 are to be analyzed.

A phenomenon has been noted which is as not yet fully understood. Light is given off from the surface materials when bombarded with the neutral beam 29 and characteristics of beam 29 may be obtained from analysis of this light. A laser 34 may be utilized in analysis of the sample to illuminate the area of bombardment and the ejected materials 40 and will induce fluorescence. A spectrometer 36 focused on the area can then identify the various reactants and products from their characteristic line radiation when excited.

Figure 6:
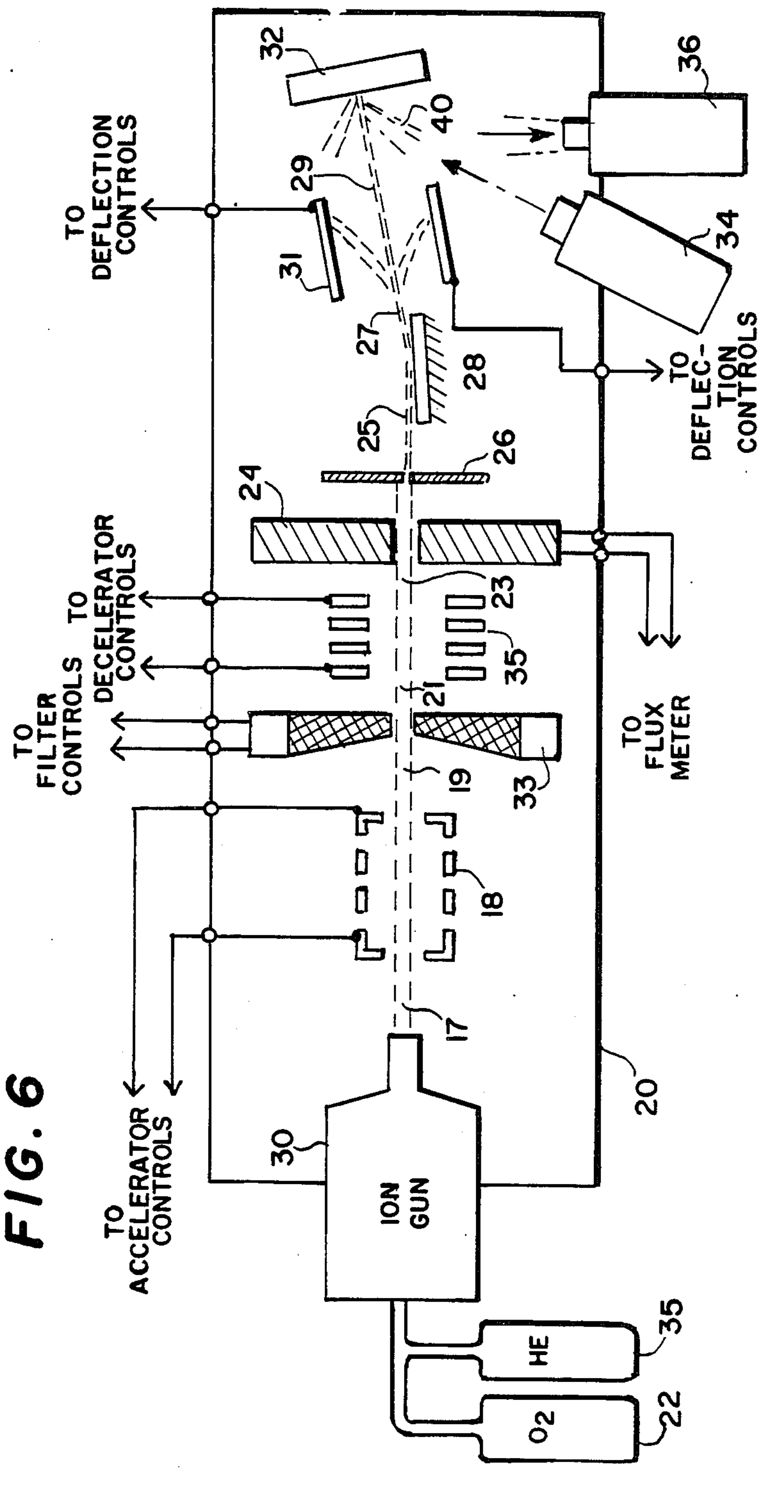
FIG. 6 is a schematic diagram of a preferred embodiment of an apparatus to produce and control neutral gas atomic and molecular beams.

Typical results with the apparatus shown schematically in FIG. 6 are as follows. Neutral oxygen beams having equivalent "currents" of up to 2 microamperes and focused to a 1 mm square area have been obtained. This corresponds to a flux of $10^{15}$ atoms/cm$^2$ sec which is on the order of magnitude of the flux in low earth orbits.

In testing materials for use on satellites and space vehicles, it is necessary that the flux be incident over a relatively large area. It will be obvious to those of skill in this art to modify the apparatus of FIG. 6 to produce neutral beams having a large cross-sectional area and to diverge such beams by the techniques disclosed in FIGS. 2 through 5. It is also desirable to test materials using multiple radiation sources producing electrons and photons as well as beams of neutral oxygen and nitrogen.

Figure 7:
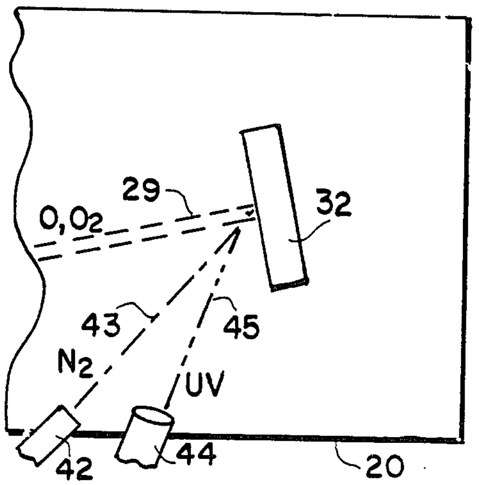
FIG. 7 is a schematic diagram of an apparatus to produce a multiple radiation environment for testing materials.

Turning now to FIG. 7, an example is shown of apparatus for producing a multiple radiation environment for sample 32 which can permit studying of the synergistic effects of such multiple sources. In this illustration, the vacuum chamber 20 includes a UV source 44 which will produce ultraviolet radiation 45 and a nitrogen particle source 42 which can produce beams of nitrogen 43 in the area of the oxygen beam 29 on material 32. Other combinations of multiple radiation sources will occur to those of skill in the art.

It will now be recognized that a method of producing a beam of nonionized gaseous atoms and molecules has been disclosed in which the following steps have been described:

1. Producing a beam of positively charged gas atoms and molecules;
2. Directing the beam at a grazing angle onto a surface formed from material to produce electronic processes which cause electrons to be contributed to the beam such that the electrons neutralize part of the beam;
3. Deflecting the partially neutralized beam from the surface; and
4. Removing remaining ionized atoms and molecules from the deflected beam.

The use of the method and apparatus of the invention for testing of materials has been discussed above. Other uses will become apparent to those of skill in the arts. For example, the method can produce beams suitable for heavy particle etching such as in the semiconductor device industry. Problems occur in making masks and other operations on integrated circuit chips when ionized beams are used for etching. The use of a neutral beam eliminates beam defocusing due to space charge and hinders charge buildup in the semiconductor materials.

Although a specific apparatus has been described, it is to be understood that the invention is not to be limited to the disclosed implementation. Various modifications will be obvious to a person skilled in the art and such changes are considered to fall within the spirit and scope of the invention.

We claim:

1. A method for producing a beam of nonionized gaseous atoms and molecules comprising the steps of:

(a) producing a beam of positively charged gas atoms and molecules;
(b) providing a surface of an electrically conductive material;
(c) directing said beam at said surface at an angle for producing electronic processes thereof which cause electrons to be contributed to said beam and to partially neutralize said positively charged gas atoms and molecules of said beam; and
(d) deflecting said partially neutralized beam from said surface.

2. A method for producing a beam of nonionized atoms and molecules of a selected gas comprising the steps of:

(a) producing a beam of positively charged atoms and molecules of said gas having contaminating gaseous materials in said beam;
(b) accelerating said beam;
(c) filtering said beam by means of a wein filter to remove said contaminating gaseous materials;
(d) decelerating said beam to a selected energy;
(e) providing a surface of an electrically conductive material;
(f) directing said decelerated beam at said surface at an angle to produce electronic processes at said surface which causes electrons to be contributed to said beam and to partially neutralize said positively charged atoms and molecules of said beam;
(g) deflecting said partially neutralized beam from said surface; and
(h) removing remaining charged atoms and molecules from said partially neutralized beam.

3. The method as recited in claim 2 in which said electrically conductive material is a metal.

4. The method as recited in claim 2 in which said electrically conductive material is a semiconductor.

5. The method as recited in claim 2 in which said electrically conductive material is nickel.

6. The method as recited in claim 2 in which said angle in step (f) is not to exceed four degrees.

7. The method as recited in claim 2 in which step (h) includes the step of directing said partially neutralized beam through an electrostatic deflector.

8. A method for analyzing the erosion effects of atomic oxygen in low earth orbits upon materials comprising the steps of:

(a) producing a beam of positively charged oxygen atoms;

(b) controlling the energy of said beam to simulate the velocity of oxygen atoms striking an object in low earth orbit;
(c) directing said beam at a conductive surface at an angle to produce electronic processes thereof to contribute electrons to said beam and to partially neutralize said positively charged oxygen beam;
(d) removing remaining charged atoms from said partially neutralized beam to produce a neutral beam of oxygen atoms;
(e) bombarding material to be analyzed with said neutral beam; and
(f) analyzing portions of said material eroded by such bombardment.

9. Apparatus for producing a beam of neutral gas atoms and molecules comprising:
a vacuum chamber;
a source of a selected gas;
an ion gun connected to said gas source for producing and injecting a beam of positively charged gas ions into said chamber;
means for controlling the energy of said beam;
neutralizing plate means having at least one plate disposed in the path of said beam of positive gas ions to cause said beam to strike a surface of said plate at an angle to produce free electrons at said surface for neutralizing a portion of said positive gas ions and to cause a partially neutralized beam to deflect therefrom; and
electrostatic deflection means disposed in the path of said deflected partially neutralized beam for separating remaining ionized atoms therefrom and to produce a neutral beam of gas atoms and molecules having a controlled energy.

10. The apparatus as recited in claim 9 in which said means for controlling the energy of said beam includes:
accelerating means for accelerating said beam; vein filter means for removing undesired contaminating ions from said beam; and
deceleration means for producing a selected energy of said beam.

11. The apparatus as recited in claim 9 in which said neutralizing plate means includes a plurality of parallel plates presenting a plurality of parallel surfaces to partially neutralize a broad cross-sectional area of said beam.

12. The apparatus as recited in claim 1 in which said neutralizing plate means includes a plurality of plates having a set of surfaces arranged to present differing angles to said beam of positive gas ions causing said partially neutralized beam deflected therefrom to converge.

13. The apparatus as recited in claim 1 in which said neutralizing plate means includes a plurality of plates having a set of surfaces arranged to present differing angles to said beam of positive gas ions causing said partially neutralized beam deflected therefrom to diverge.

14. The apparatus as recited in claim 1 in which said neutralizing plate means includes a plurality of flat plates in which each plate is individually pivotable to permit independent adjustment of the angle presented to said beam by each of said flat plates.

15. The apparatus as recited in claim 1 in which said neutralizing plate means includes a plurality of concentric cylindrical surfaces arranged to cause said partially neutralized beam to be essentially cylindrical.

16. Apparatus for producing a beam of neutral gas atoms and molecules comprising:
(a) a vacuum chamber;
(b) a source of a selected gas;
(c) an ion gun connected to said gas source for producing and injecting a beam of positively charged gas ions into said chamber;
(d) means for controlling the energy level of said beam, said means including
(i) accelerating means for accelerating said beam,
(ii) filter means for removing undesired contaminating ions from said beam, and
(iii) deceleration means for producing a selected energy level of said beam;
(e) neutralizing plate means having a plurality of plates disposed in the path of said beam of positive gas ions to cause said beam to strike surfaces of said plates at an angle to produce photoionization at said surfaces for neutralizing a portion of said positive gas ions and to cause a partially neutralized beam to deflect therefrom, said plurality of plates arranged to cause said partially neutralized beam to be formed in a preselected shape; and
(f) electrostatic deflection means disposed in the path of said deflected and shaped partially neutralized beam for separating remaining ionized atoms therefrom to produce a neutral beam of gas atoms and molecules having a controlled energy level.

* * * * *

UNITED STATES PATENT AND TRADEMARK OFFICE

CERTIFICATE OF CORRECTION

PATENT NO. : 4,775,789

DATED : Oct. 4, 1988

INVENTOR(S) : Albridge, Jr., Royal G.; Haglund, Jr., Richard F.; Snowden, Kenneth J.; Tolk, Norman H.

It is certified that error appears in the above-identified patent and that said Letters Patent is hereby corrected as shown below:

Please add to the cover page:

ASSIGNEE: Martin Marietta Corporation, Bethesda, Maryland

Signed and Sealed this

Second Day of May, 1989

*Attest:*

DONALD J. QUIGG

*Attesting Officer*

*Commissioner of Patents and Trademarks*